(12) United States Patent
Daldoss et al.

(10) Patent No.: US 7,644,388 B1
(45) Date of Patent: Jan. 5, 2010

(54) METHOD FOR REDUCING LAYOUT PRINTABILITY EFFECTS ON SEMICONDUCTOR DEVICE PERFORMANCE

(75) Inventors: Lidia Daldoss, San Jose, CA (US); Sharad Saxena, Richardson, TX (US); Christoph Dolainsky, Wessling (DE); Rakesh R. Vallishayee, San Jose, CA (US)

(73) Assignee: PDF Solutions, Inc., San Jose, CA (US)

( * ) Notice: Subject to any disclaimer, the term of this patent is extended or adjusted under 35 U.S.C. 154(b) by 327 days.

(21) Appl. No.: 11/540,453

(22) Filed: Sep. 29, 2006

(51) Int. Cl.
*G06F 17/50* (2006.01)

(52) U.S. Cl. .................. 716/21; 716/4; 716/5; 716/19

(58) Field of Classification Search ............ None
See application file for complete search history.

(56) References Cited

U.S. PATENT DOCUMENTS

| | | | |
|---|---|---|---|
| 6,289,499 B1 * | 9/2001 | Rieger et al. ............ 716/21 |
| 6,393,602 B1 * | 5/2002 | Atchison et al. ........... 716/4 |
| 6,602,728 B1 | 8/2003 | Liebmann et al. |
| 6,768,983 B1 * | 7/2004 | Jakatdar et al. .......... 706/46 |
| 6,795,952 B1 * | 9/2004 | Stine et al. ............... 716/5 |
| 6,883,158 B1 | 4/2005 | Sandstrom et al. |
| 6,918,101 B1 * | 7/2005 | Satya et al. .............. 716/5 |
| 7,027,143 B1 | 4/2006 | Stokowski et al. |
| 7,123,356 B1 | 10/2006 | Stokowski et al. |
| 7,136,796 B2 * | 11/2006 | Jakatdar et al. .......... 703/13 |
| 7,348,594 B2 * | 3/2008 | Ciplickas et al. ......... 257/48 |
| 7,353,475 B2 * | 4/2008 | White et al. ............. 716/5 |
| 7,367,008 B2 * | 4/2008 | White et al. ............ 716/19 |
| 7,379,175 B1 | 5/2008 | Stokowski et al. |
| 7,382,149 B2 * | 6/2008 | Anand et al. ........... 324/769 |
| 7,434,197 B1 * | 10/2008 | Dolainsky et al. ........ 716/19 |
| 2002/0073388 A1 * | 6/2002 | Orshansky et al. ........ 716/5 |
| 2007/0234246 A1 * | 10/2007 | Sinha et al. ............. 716/4 |
| 2008/0222584 A1 * | 9/2008 | Habib et al. ............. 716/5 |

* cited by examiner

*Primary Examiner*—Leigh Marie Garbowski (57) ABSTRACT

A printability simulation is performed on a mask layout over a range of lithography process conditions. A layout configuration capable of inducing functional or parametric failure in a semiconductor device is identified in the mask layout. A test structure representative of the identified layout configuration is obtained. A design of experiment is associated with the test structure. The design of experiment is defined to investigating effects of variations of one or more layout attributes in the test structure. Multiple instance of the test structure are fabricated on a wafer according to the design of experiment. Electrical performance characteristics of the fabricated test structures are measured. Based on the measured electrical performance characteristics, one or more layout attributes of the test structure capable of causing functional or parametric failure are determined.

20 Claims, 12 Drawing Sheets

| Test Structure | Purpose | Test Structure Layout Attributes |
|---|---|---|
| TRREF (200) | Characterize device variability not related by layout effects | Gate width, gate length, device orientation |
| TRPITCH (800) | Characterize/reduce poly pitch effect | Gate Width, gate length, device orientation, poly space |
| TRNOTCH (300) | Characterize/reduce poly necking/flaring effect | Gate width, gate length, poly notch width (310), poly notch distance to active (308), poly notch height (306) |
| TRUNOTCH (400) | Characterize/reduce active area necking/flaring effect | Gate width, gate length, gate width extension, active to gate space, poly endcap |
| TRJOINED (600) | Characterize/reduce active necking/flaring effect | Gate width, gate length, gate to poly space, gate to active space, gate width extension |

Fig. 7

METHOD FOR REDUCING LAYOUT PRINTABILITY EFFECTS ON SEMICONDUCTOR DEVICE PERFORMANCE

CROSS-REFERENCE TO RELATED APPLICATION

This application is related to U.S. patent application Ser. No. 10/595,703, filed on May 5, 2006, and entitled "Generalization of the Photo Process Window and its Application to OPC Test Pattern Design." The disclosure of this related application is incorporated herein by reference.

BACKGROUND

Semiconductor device performance variability and yield loss can be caused by layout-dependent effects related to pattern printability. Examples of such layout-dependent effects include line end shortening, MOSFET gate flaring, MOSFET gate necking, etc. The criticality of a layout pattern with regard to adverse layout-dependent effects is traditionally characterized by the geometric deviation of the as-printed layout pattern from the ideal layout pattern, based on a real image. Also, the criticality of a layout pattern can be characterized by its sensitivity to a particular fabrication process, wherein sensitivity is defined by a proclivity toward non-ideal geometric deviation due to the particular fabrication process conditions.

In nanometer scale technologies, device performance variability due to layout-dependent effects could cause functional and parametric yield losses. Therefore, maintaining performance and process margin across different layout styles and environments is a critical issue for nanometer scale technologies. The criticality of performance and process margin are driven by more aggressive sub-wavelength lithography and device scaling, combined with increasing operating frequencies into the multi-GHz range, which contribute to increase the sensitivity of circuit performance to layout configuration. Additionally, newer technologies are giving rise to new phenomena of significance, such as neighborhood dependent and systematic within-die variations in polysilicon critical dimension (CD), two-dimensional environment effects on printability, narrow width effects, etc.

SUMMARY

In one embodiment, a method is disclosed for reducing layout printability effects on semiconductor device performance. The method includes an operation for performing a printability simulation on a mask layout over a range of lithography process conditions. An operation is also provided for identifying a layout configuration in the mask layout that is capable of inducing functional or parametric failure in a semiconductor device. A test structure that is representative of the identified layout configuration is obtained. A design of experiment is associated with the test structure. The design of experiment is defined to investigate effects of variations of one or more layout attributes in the test structure. The method further includes an operation for fabricating multiple instances of the test structure on a wafer according to the design of experiment. One or more electrical performance characteristics of the fabricated test structures are measured. Based on the measured electrical performance characteristics, an operation is performed to determine one or more layout attributes of the test structure that are capable of causing functional or parametric failure.

In another embodiment, a method is disclosed for reducing semiconductor device performance variability and yield loss. The method includes an operation for performing a printability simulation on a semiconductor device mask layout to identify a critical layout configuration. An operation is also performed to develop a test structure to emulate the identified critical layout configuration. The method also includes fabricating a test wafer to include multiple instances of the test structure. Each instance of the test structure represents a variation in one or more layout attributes of the test structure. The method includes and operation for measuring one or more electrical performance characteristics of each test structure instance fabricated on the test wafer. The measured electrical performance characteristics are processed to determine one or more layout attributes of the test structure that are capable of causing functional or parametric failure. Based on the determined layout attributes of the test structure that are capable of causing functional or parametric failure, an operation is performed to identify design changes, process changes, or a combination thereof, to reduce functional or parametric failure of the identified critical layout configuration in the semiconductor device.

In another embodiment, a method is disclosed for defining a semiconductor device design and fabrication process window with respect to electrical performance. The method includes an operation for obtaining a test structure from a library of test structures defined to emulate critical layout configurations sensitive to printability effects known to be prevalent in semiconductor device mask layouts. The method also includes an operation for fabricating a test wafer to include multiple instances of the test structure. Each instance of the test structure represents a variation in one or more attributes of the test structure. Another operation is performed to measure electrical performance characteristics of each test structure instance fabricated on the test wafer. The measured electrical performance characteristics are processed to identify unacceptable electrical performance of the test structure as a function of variation in the test structure attributes.

Other aspects of the invention will become apparent from the following detailed description, taken in conjunction with the accompanying drawings, illustrating by way of example the principles of the invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

It should be appreciated that the present invention can be implemented in numerous ways, including as a process, an apparatus, a system, a device, or a method. Several exemplary embodiments of the invention will now be described in detail with reference to the accompanying drawings.

For an as-fabricated semiconductor device ("device" hereafter) to be considered acceptable, the device's operation must be correct and must satisfy certain performance criteria. To provide for device performance and yield stability, it is necessary during design and fabrication of the device to identify layout configurations and fabrication process conditions that could potentially cause device functional and parametric failures. One approach for addressing layout-dependent printability issues in the interest of reducing device performance variability and yield loss is focused on geometric analysis of as-fabricated layout features. More specifically, sophisticated simulation algorithms, such as those described in U.S. patent application Ser. No. 10/595,703, entitled "Generalization of the Photo Process Window And its Application to OPC Test Pattern Design, are used to predict or identify deviations of the as-fabricated layout feature geometry from the drawn layout feature geometry. The entirety of U.S. patent application Ser. No. 10/595,703, is incorporated herein by reference.

Based on the predicted or identified geometric deviations of the as-fabricated layout features, the electrical performance of the devices associated with the as-fabricated layout features are simulated to determine whether or not the geometric deviations result in acceptable or unacceptable device performance variations. It should be appreciated that prediction or identification of the impact on device performance due to the as-fabricated layout feature geometric deviations includes both the uncertainty associated with the device electrical performance prediction and the uncertainty associated with the geometric deviation prediction. The predictive uncertainties for layout printability and device electrical performance represent barriers to further improvements with regard to device performance variability and yield loss.

A novel approach for addressing layout-dependent printability issues in the interest of reducing device performance variability and yield loss is disclosed herein. This novel approach is defined as a method of reducing layout printability effects on semiconductor device performance. The method serves to diagnose, quantify, and reduce the impact of layout printability effects on transistor variability that causes device performance degradation. The method does not suffer from the barriers represented by the combined predictive uncertainties for layout printability and device performance, as mentioned above.

Figure 1:
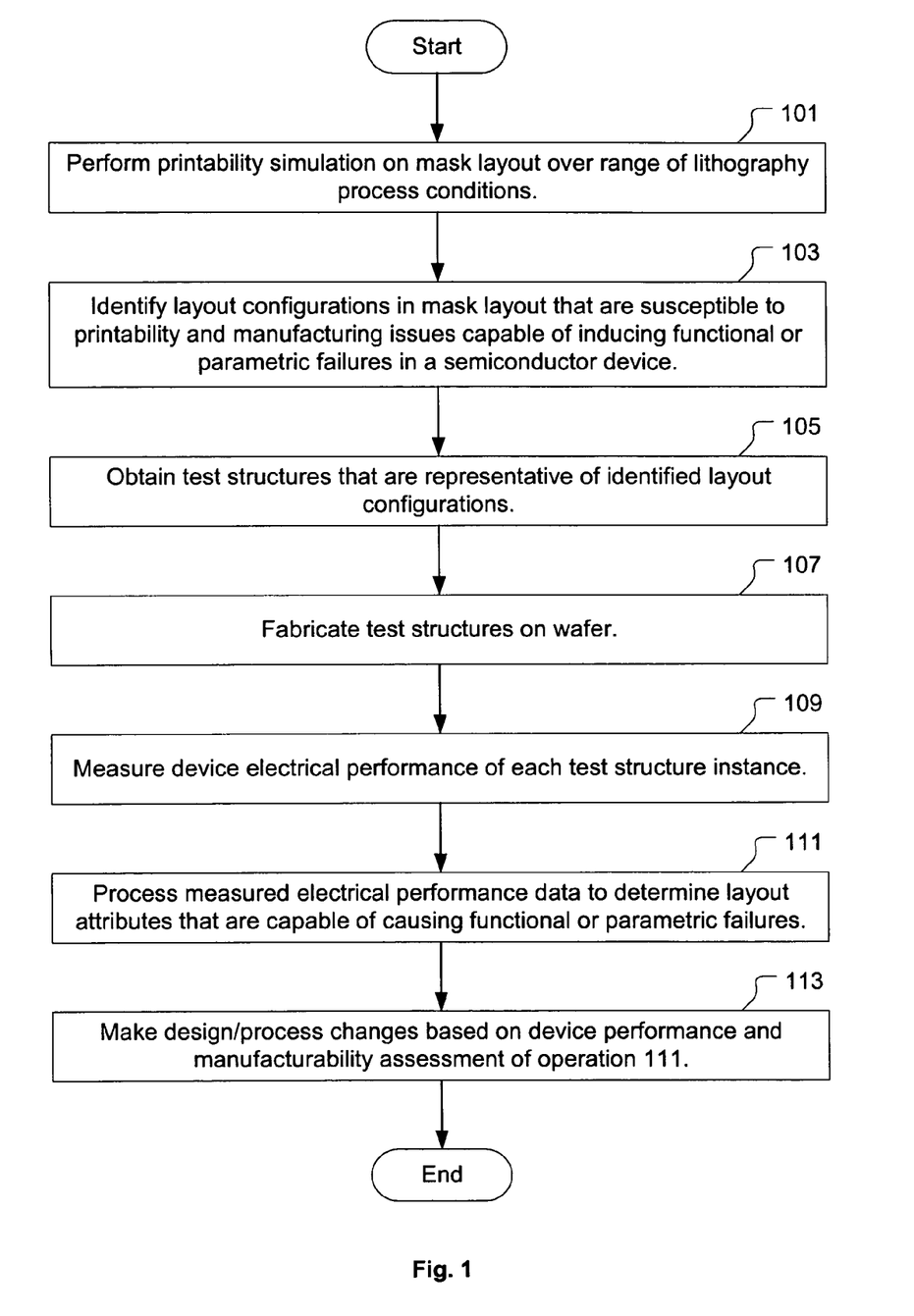
FIG. 1 is an illustration showing a flowchart of a method for reducing layout printability effects on semiconductor device performance, in accordance with one embodiment of the present invention.

FIG. 1 is an illustration showing a flowchart of a method for reducing layout printability effects on semiconductor device performance, in accordance with one embodiment of the present invention. The method includes an operation 101 for performing printability simulation on a mask layout over a range of lithography process conditions (e.g., defocus, exposure, etc.). The printability simulation is capable of revealing printability and manufacturing issues related to mask error, defocus, exposure, resist effects, etch effects, critical dimension (CD), misalignment, line end, flaring, necking, etc. on the mask layout.

After performing printability simulation, an operation 103 is performed to identify specific layout configurations that are susceptible to printability and manufacturing issues capable of inducing functional or parametric failures in a semiconductor device. In one embodiment, operation 103 is performed by analyzing a mask layout to identifying the specific layout configurations that are susceptible to printability and manufacturing issues capable of inducing functional or parametric failures. A region where such printability and manufacturing issues occur in the mask layout is called "hot spot". Thus, the hot spots are the areas of the mask layout where printability and manufacture issues could induce functional or parametric failures.

In a second embodiment, operation 103 includes accessing a library of previously identified layout patterns/environments known to be sensitive to printability effects. The second embodiment is most likely utilized when the mask layout for the product of interest is not available and the printability simulation cannot be carried out. It should be appreciated that if the printability analysis is employed in operation 103, the results thereof can be used to further populate the library associated with the second embodiment.

The method continues with an operation 105 in which test structures that are representative of the identified layout configurations are obtained. These test structures may be obtained from a library of test structures. However, if there are no existing test structures with layouts that are similar to or representative of the identified layout configurations on the mask layout, then new test structures can be designed as part of operation 105, such that test structures similar to or representative of the identified layout configurations become available. The test structures obtained in operation 105 are capable of emulating the configurations or patterns of the mask layout that are affected by printability degradation and manufacturing deficiencies for different technology nodes.

FIGS. 2A, 3A, 4A, 5A, and 6A are illustrations showing exemplary test structures developed through performance of operation 105, in accordance with one embodiment of the present invention. It should be understood that the test structures shown in FIGS. 2A, 3A, 4A, 5A, and 6A are provided for exemplary purposes and in no way represent an exhaustive set of test structures. However, it should be appreciated that the test structures shown in FIGS. 2A, 3A, 4A, 5A, and 6A are defined to emulate actual active device layout configurations known to be affected by printability degradation and manufacturing deficiencies.

Figure 2A:
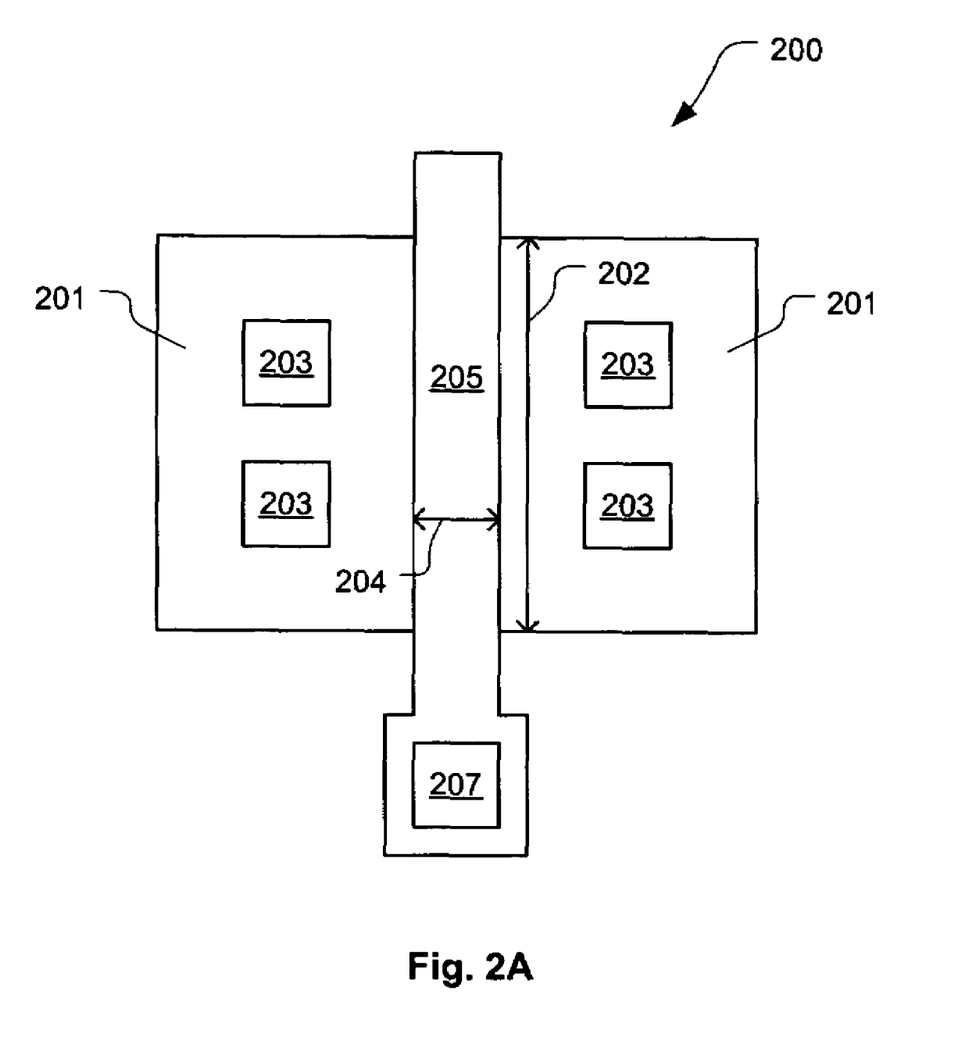
FIG. 2A is an illustration showing a reference test structure TRREF developed to characterize a baseline device performance variability not induced by layout effects, in accordance with one embodiment of the present invention.

FIG. 2A is an illustration showing a reference test structure TRREF 200 developed to characterize a baseline device performance variability not induced by layout effects, in accordance with one embodiment of the present invention. The reference test structure TRREF 200 includes a diffusion region (active area) 201 of width 202, diffusion contacts 203, a polysilicon gate 205 of length 204, and a polysilicon contact 207. The diffusion region 201 can be doped to form either an n-channel transistor or a p-channel transistor.

The type of variability investigated by the reference test structure TRREF 200 depends on the fabrication process more than on the actual layout characteristics. Therefore, TRREF 200 is used mainly to observe the variability within-die, within-wafer zone, or between wafers. More precisely, the reference test structure TRREF 200 is not subject to layout-dependent effects and can be used as a comparative reference for other test structures that are susceptible to printability issues.

Figure 3A:
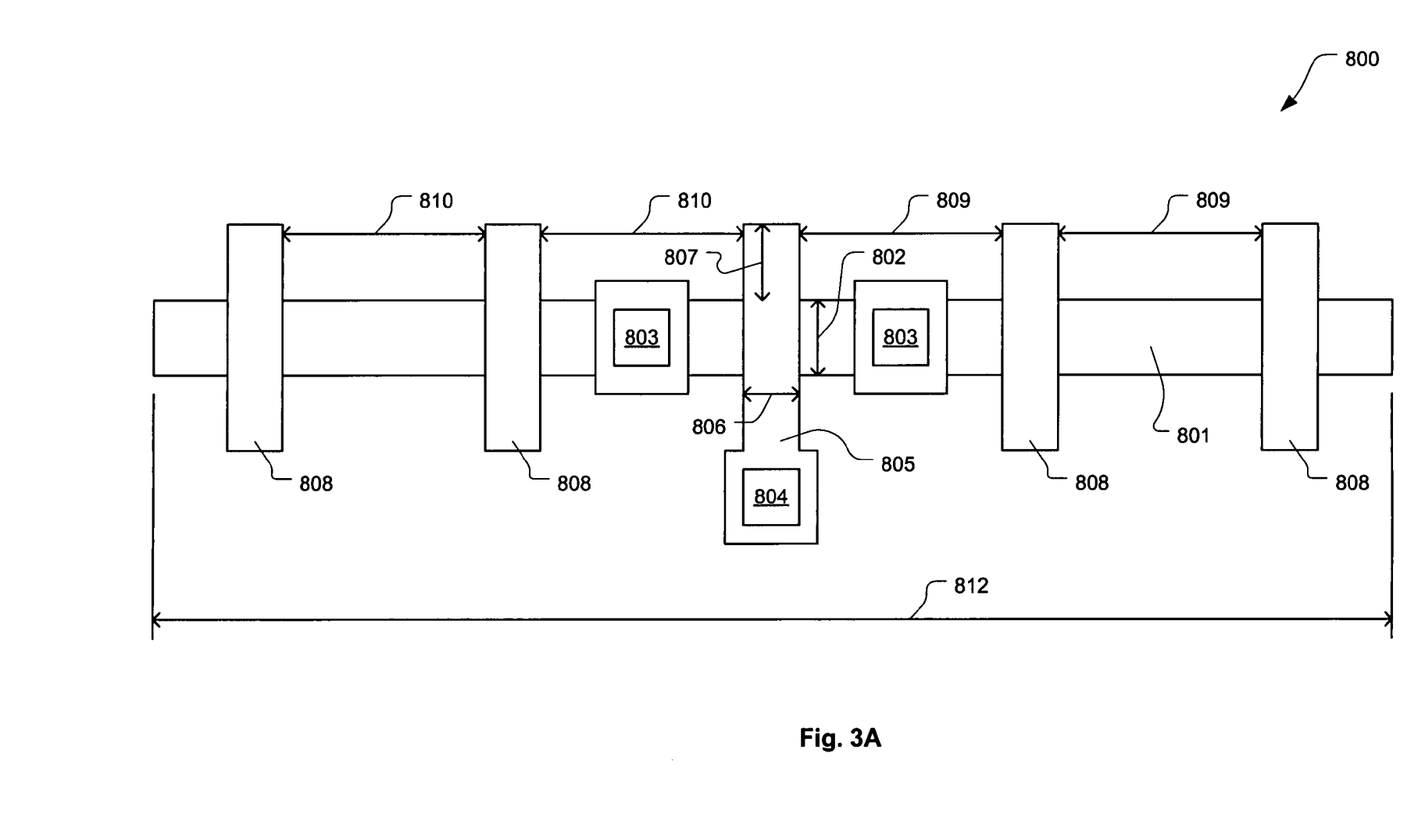
FIG. 3A is an illustration showing a test structure TRPITCH developed to emulate the impact of gate poly silicon proximity effect on transistor performance, in accordance with one embodiment of the present invention.

FIG. 3A is an illustration showing a test structure TRPITCH 800 developed to emulate the impact of gate poly silicon proximity effect on transistor performance, in accordance with one embodiment of the present invention. The reference test structure TRPITCH 800 includes a diffusion region (active area) 801 of width 802 and length 812, diffusion contacts 803, a polysilicon contact 804, a polysilicon gate 805 of length 806 with an endcap of width 807, and neighboring poly bars 808 spaced by distances 809 and 810 that are not necessarily symmetrical with respect to the polysilicon gate 805. The diffusion region 801 can be doped to form either a n-channel transistor or a p-channel transistor. Also, the structure can be designed with different poly silicon orientation (horizontal or vertical) to determine the impact of orientation on poly printability.

Poly silicon pitch effect represents a major printability concern for nanotechnology structures due to the use of printed feature sizes approaching the resolution limit of the lithography tools. Therefore, the line width variation of the polysilicon gate and the line-end effects are highly dependent on the neighboring environment, e.g., dummy poly lines density and placement.

Figure 4A:
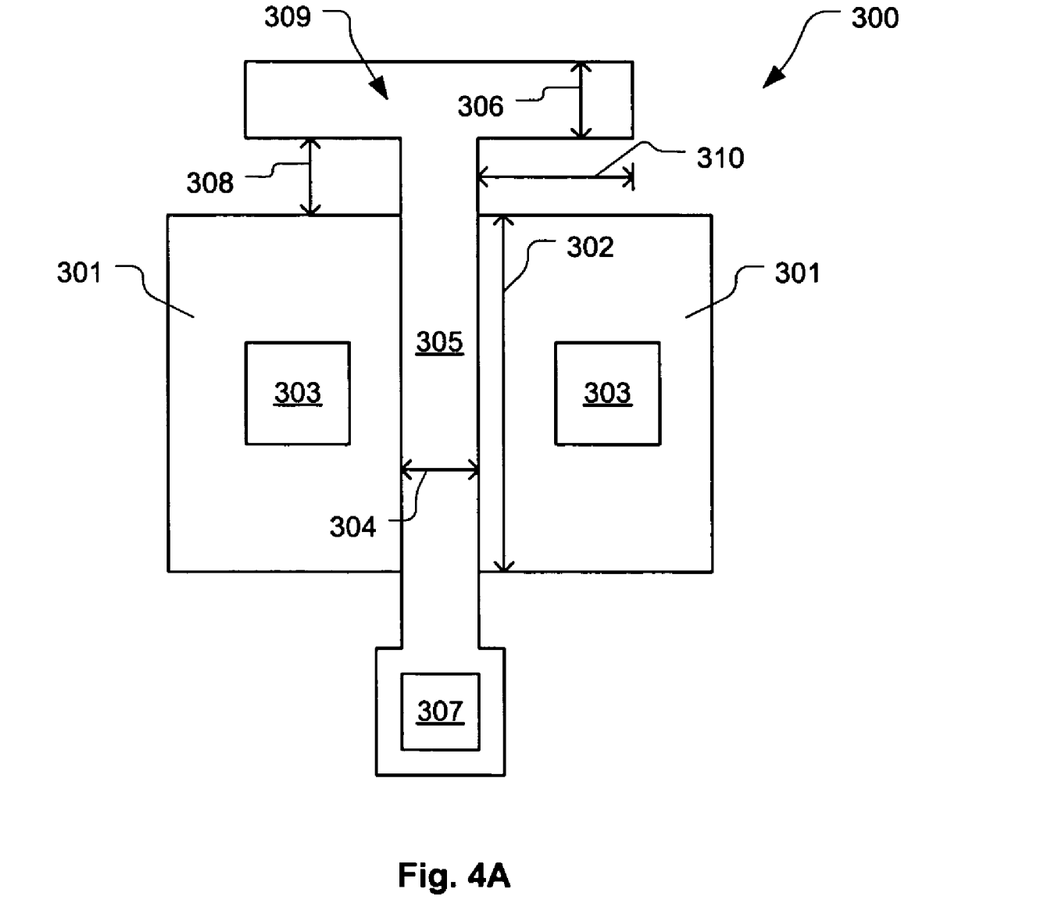
FIG. 4A is an illustration showing a test structure TRT-NOTCH developed to emulate a layout configuration, in accordance with one embodiment of the present invention.

FIG. 4A is an illustration showing a test structure TRTNOTCH 300 developed to emulate a layout configuration, in accordance with one embodiment of the present invention. The test structure TRTNOTCH 300 is defined to highlight polysilicon flaring and necking effects in the critical layout configuration. The test structure TRTNOTCH 300 includes a diffusion region (active area) 301 of width 302, diffusion contacts 303, a polysilicon gate 305 of length 304 having a T-shaped endcap 309, and a polysilicon contact 307. The T-shaped polysilicon endcap 309 is defined to have a width 306, be offset from the diffusion region 301 by a distance 308, and extend horizontally from the polysilicon gate 305 edge by a distance 310. Also, the diffusion region 301 can be doped to form either an n-channel transistor or a p-channel transistor. The test structure TRTNOTCH 300 is used to investigate the transistor performance of devices having an analogous layout pattern.

Figure 5A:
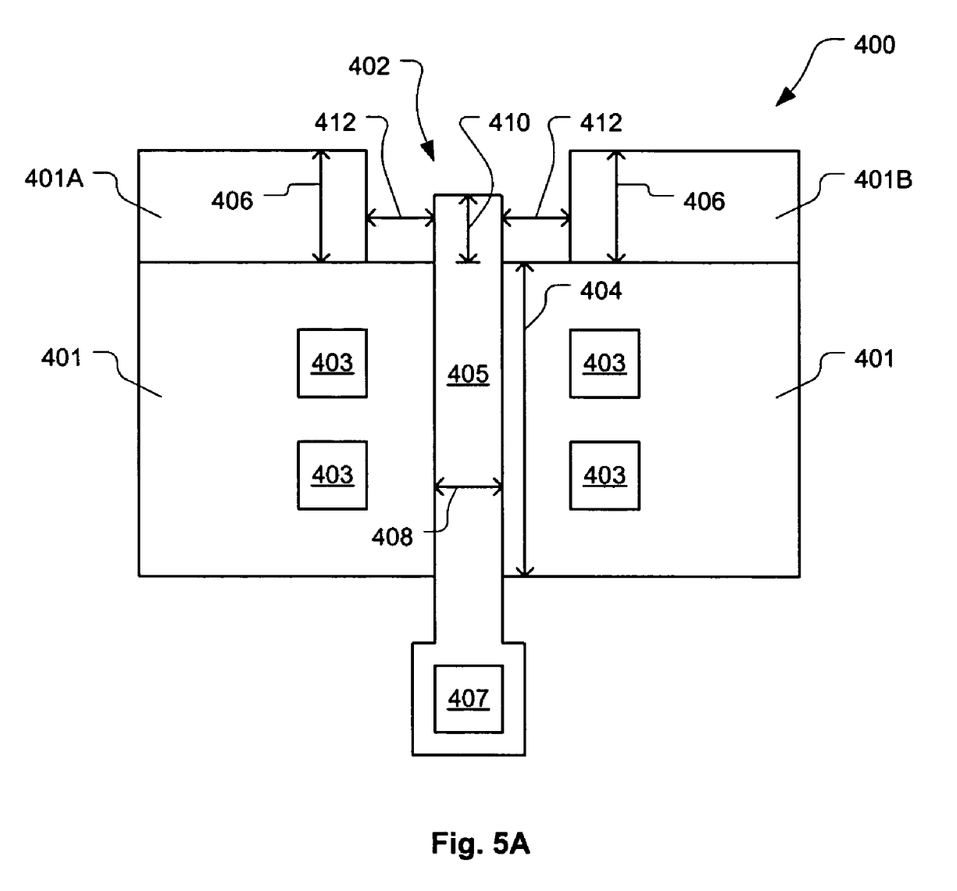
FIG. 5A is an illustration showing a test structure TRUNOTCH developed to emulate a layout configuration, in accordance with one embodiment of the present invention.

FIG. 5A is an illustration showing a test structure TRUNOTCH 400 developed to emulate a layout configuration, in accordance with one embodiment of the present invention. The test structure TRUNOTCH 400 is defined with a U-shaped active notch 402 to highlight active region flaring effects in the critical layout configuration. The test structure TRUNOTCH 400 includes a diffusion region 401 of width 404, a left-side diffusion region extension 401A of width 406, a right-side diffusion region extension 401B of width 406, diffusion contacts 403, a polysilicon gate 405 of length 408 having an endcap of width 410, and a polysilicon contact 407. The horizontal space between the polysilicon endcap and the diffusion region extensions 401A/401B is defined by a distance 412. Also, the diffusion region 401 can be doped to form either an n-channel transistor or a p-channel transistor. The test structure TRUNOTCH 400 is used to investigate the transistor performance of devices having an analogous layout pattern.

Figure 6A:
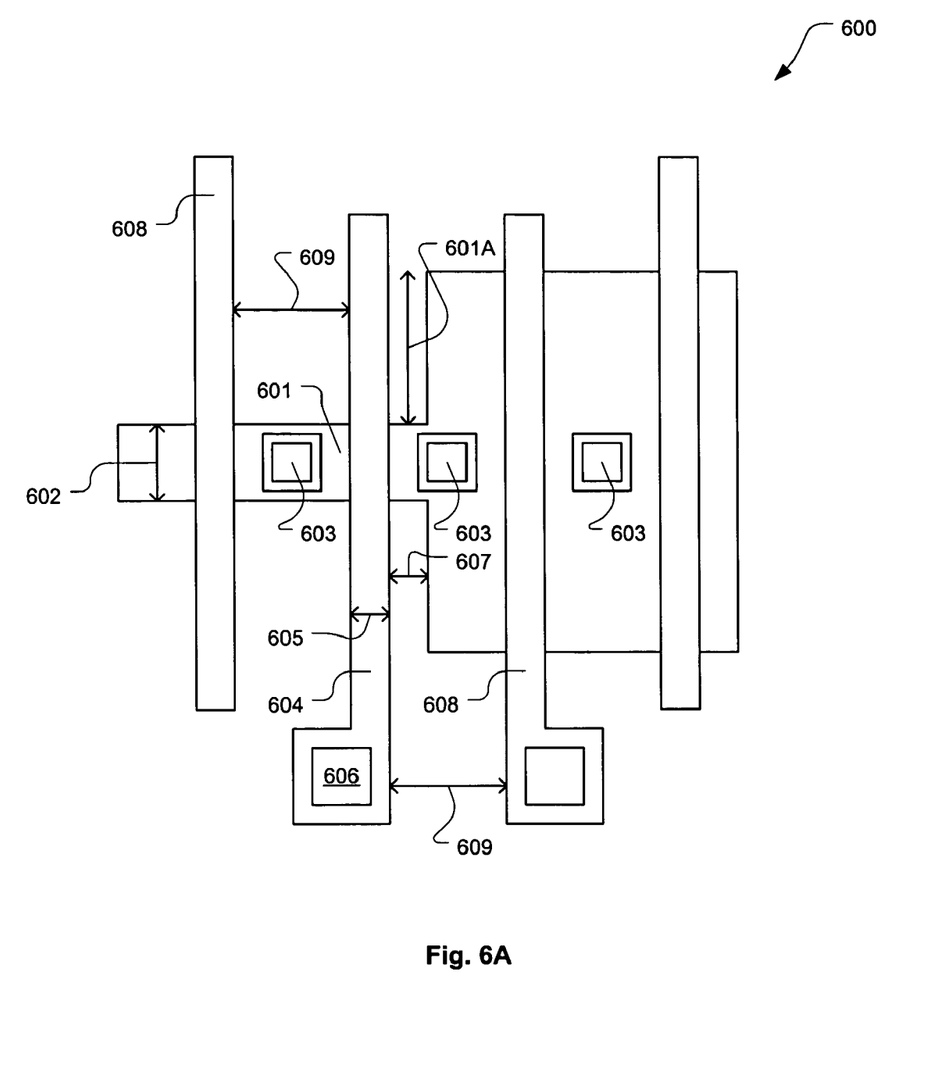
FIG. 6A is an illustration showing a test structure TRJOINED developed to emulate a layout configuration, in accordance with one embodiment of the present invention.

FIG. 6A is an illustration showing a test structure TRJOINED 600 developed to emulate a layout configuration, in accordance with one embodiment of the present invention. The test structure TRJOINED 600 is designed to verify active flaring effects in the identified layout configuration. The test structure TRJOINED 600 includes a diffusion region 601 of width 602, with a diffusion region extension of width 601A and diffusion contacts 603, a polysilicon gate 604 of length 605 with a distance 607 from the diffusion region extension. Polysilicon contact 606 is connected to polysilicon gate 604. Dummy poly lines 608 are placed at a distance 609 from the polysilicon gate 604. Also, the diffusion 601 can be doped to form either an n-channel transistor or a p-channel transistor. The test structure TRJOINED 600 is used to investigate the transistor performance of device having an analogous layout pattern.

With reference back to FIG. 1, following operation 105, the method continues with an operation 107 for fabricating the test structures on a test wafer. A design of experiment (DOE) is applied to the test structures. The DOE is capable of investigating the effects of variations of the layout attributes of the test structures on the performance of the semiconductor device. In addition, the DOE is capable of investigating the effects of variations in the fabrication process steps for fabricating the test structures on the performance of the resulting semiconductor device. The DOE for design attributes, i.e., design DOE, is defined to vary the layout attributes of the test structure layout configurations. The DOE for fabrication process attributes, i.e., process DOE, is defined to vary the fabrication process attributes for producing the test structure layout configurations. The process DOE may employ the use of split lots. For example, the test structure variations defined by a given design DOE may be fabricated using different fabrication processes as defined by the process DOE. Test wafers associated with the different fabrication processes represent the split lots.

Figure 7:
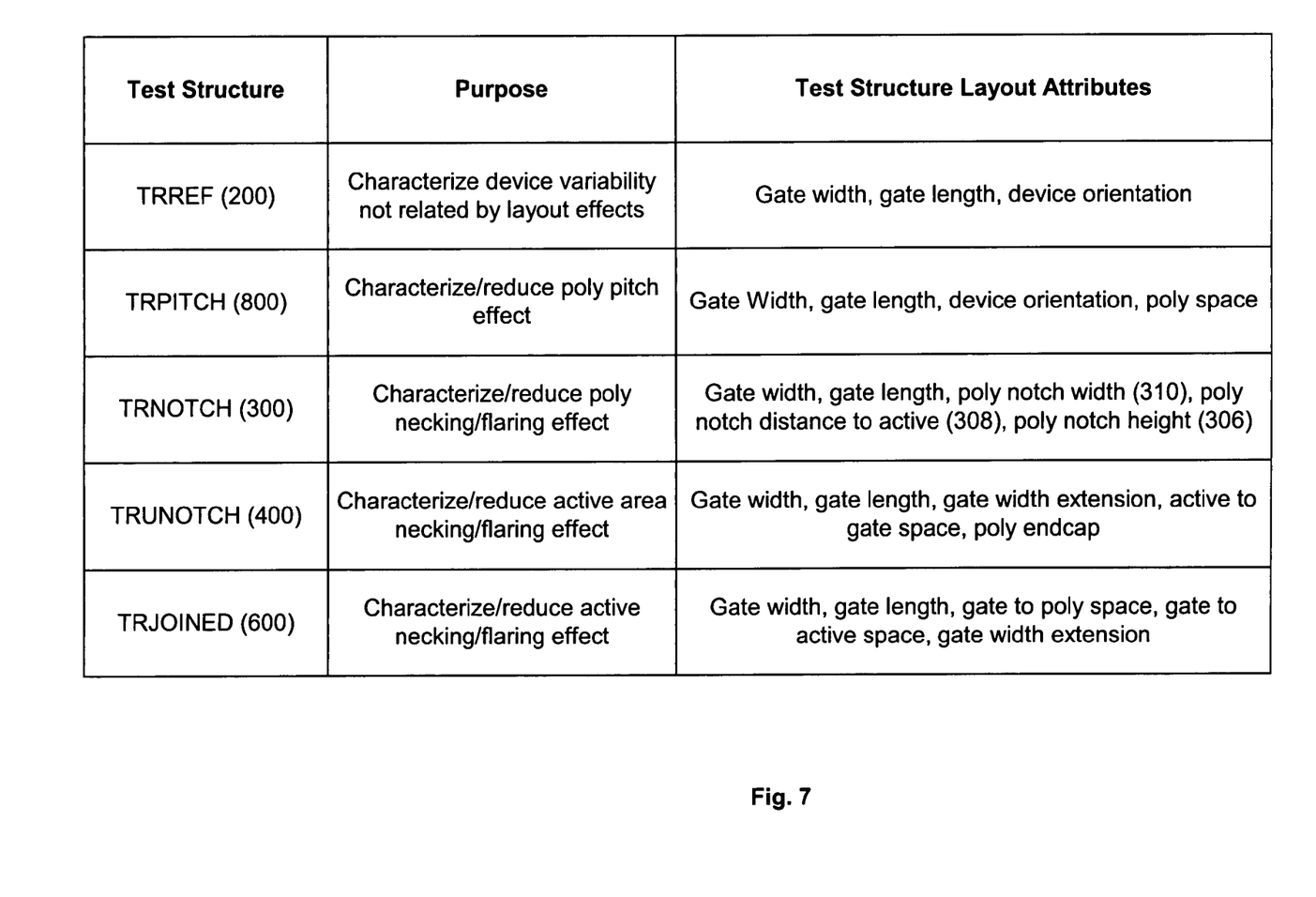
FIG. 7 illustrates a summary table for a set of exemplary test structures and the identified layout attributes, in accordance with one embodiment of the present invention.

FIG. 7 illustrates a summary table for a set of exemplary test structures and the identified layout attributes, in accordance with one embodiment of the present invention. It should be understood that the test structures are provided for exemplary purposes and in no way represent an inclusive set of test structures. The TRREF 200 test structure is defined to investigate how variations in gate width, gate length, and device orientation affect device electrical performance. The TRPITCH 800 test structure enable quantification of device performance variations due to variations in gate width, gate length, poly orientation, and poly pitch. The TRTNOTCH 400 test structure is designed to investigate poly necking/flaring effects in response to variations in gate width, gate length, width of the T-shaped endcap, height of the T-shaped endcap, and distance between diffusion region and T-shaped endcap. The TRUNOTCH 400 test structure is defined to investigate how variations in gate length, gate width, gate extension width, polysilicon endcap width, and active-to-gate distance affect device electrical performance due to active diffusion flaring/necking. The TRJOINED 600 test structure is defined to investigate how variations in gate length, gate width, gate extension width, gate-to-active space, and gate-to-poly space affect device electrical performance.

It should be appreciated that if required by a layout DOE or process DOE, multiple test wafers or split lots may be fabricated in operation 107. The layout DOE can define essentially any type of variations in the layout attributes to fabricate the test structure instances on the test wafers. The process DOE defines certain variations in the process conditions in the fabrication processes for fabricating the test structure instances in the fabrication steps that are important for the layout configures that are being investigated.

Once the test structure instances defined by the DOEs are fabricated on the test wafers, an operation 109 is performed to measure the device electrical performance of each test structure instance. It should be appreciated that the method involves actual physical measurements of the electrical performance of fabricated test structures, rather than simply relying on simulations, i.e., predictions, of the electrical performance.

It should be further appreciated that essentially any electrical parameter associated with a CMOS transistor can be identified for measurement in operation 109. Examples of some electrical parameters to be measured include: threshold voltage (Vt), saturation voltage (Vtsat), saturation drain current (Idsat), maximum current available in device (Ion), and standby current between drain and source (Ioff). An additional parameter of interest in the active test structure measurement plan is DIBL (drain induced barrier lowering) defined by Vtlin-Vtsat. An Id-Vg sweep provides Vtlin, Vtsat, Ioff and Idsat values. Also, the gate-to-channel leakage (Ig) can be measured, wherein Vg=Vdd and Vs=Vd=Vb=0. The measured gate-to-channel leakage (Ig) serves to characterize the product of channel width and length. Additionally, a measurement plan can be established to characterize asymmetry between the source and drain regions. This asymmetry characterization essentially involves a swapping of the source and drain connectivity.

In one embodiment, the electrical performance measurement data is stored in a database. A schema for this database can be defined to include essentially all information relevant to the various test structures developed, fabricated, and measured according to the method of FIG. 1. In one embodiment, this database can be used as, or in support of, the library of layout configurations discussed with respect to operation 105. In one embodiment, time constraints may require that a subset of test structures have electrical performance measurements performed thereon. In this embodiment, a printability simulation of the various test structures can be performed using a calibrated lithography module to identify candidate test structures for electrical performance measurement.

The method of FIG. 1 further includes an operation 111 for processing the measured electrical performance data of the test structures to determine the layout attributes of the test structures or test structure instances that are capable of causing functional or parametric failures. The electrical performance measurements for the test structures or test structure DOEs are quantified and correlated to the layout variations represented by the various instances of the test structures. From these quantifications and correlations, a process margin can be quantified with respect to device performance (e.g., functional and parametric failures, etc.). The process margin represents how much deviation from the nominal layout attribute or design rule can exist while still maintaining acceptable device performance. Thus, the method enables evaluation of how much printability issues affect device performance.

The electrical performance measurements of the test structures can be used to investigate layout sensitivities due to printability issues, fabrication issues, etc., depending on the type of test structures and the DOE. The test structures and their associated electrical measurement data can be further parameterized by wafer identifier, wafer zone, and within-die characteristics such as test structure neighborhood features. Also, the variability associated with the reference test structures can be analyzed within-wafer, lot-to-lot, wafer-to-wafer, die-to-die, and within-die, among others.

Figure 2B:
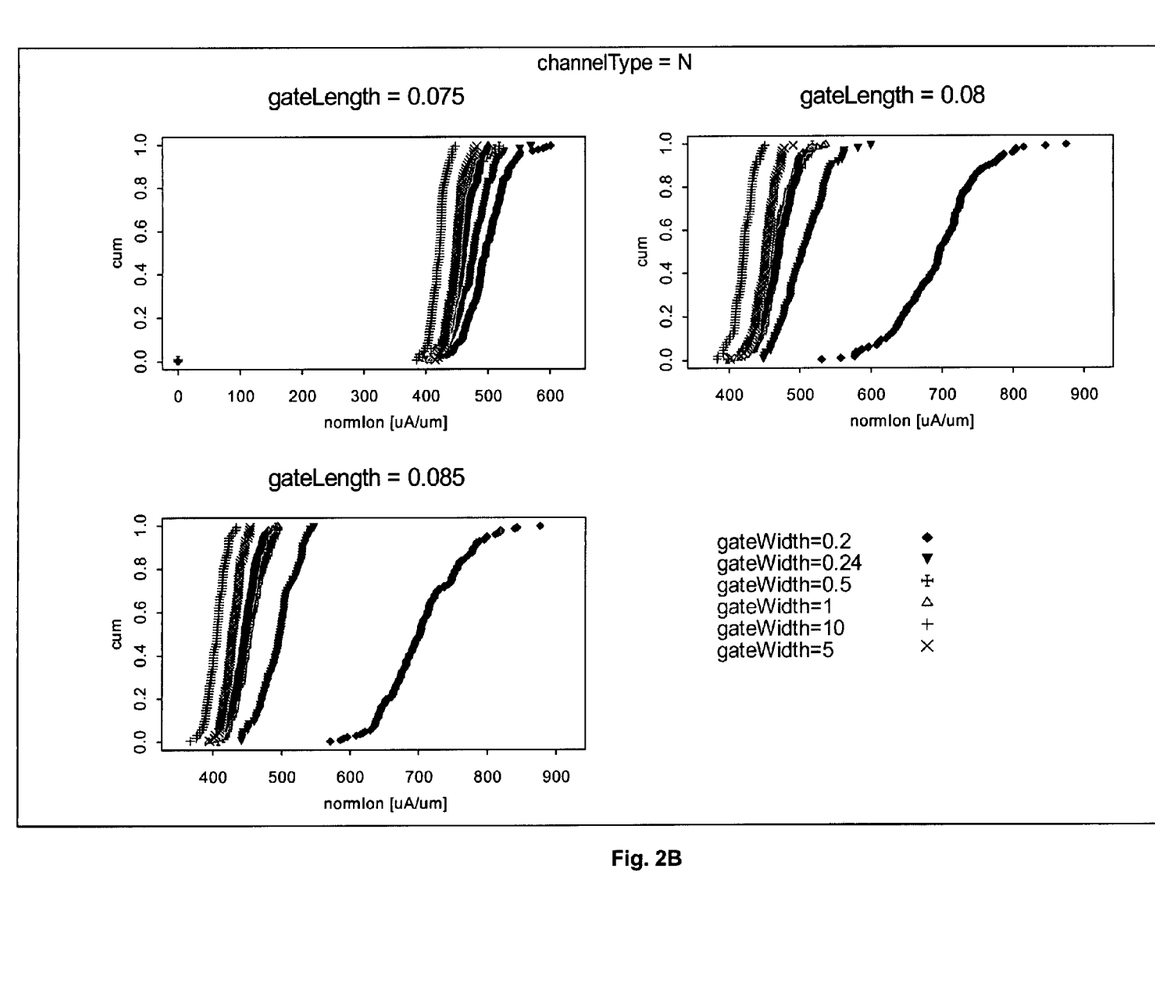
FIG. 2B is an illustration showing an exemplary processing of electrical measurement data associated with the n-channel versions of the test structure TRREF of FIG. 2A, in accordance with one embodiment of the present invention.

FIG. 2B is an illustration showing an exemplary processing of electrical measurement data associated with the n-channel versions of the test structure TRREF 200 of FIG. 2A, in accordance with one embodiment of the present invention. FIG. 2B shows plots of the normalized current in saturation (Ion) cumulative distribution functions for the various investigated gate widths 202 and gate lengths 204. By way of example, based on the plots of FIG. 2B it can be seen that the minimum investigated gate width 202 of 0.2 micron with the design rule gate length 204 of 0.08 micron has significantly higher saturation current than a corresponding specification limit of 570 microamps per micron.

Figure 3B:
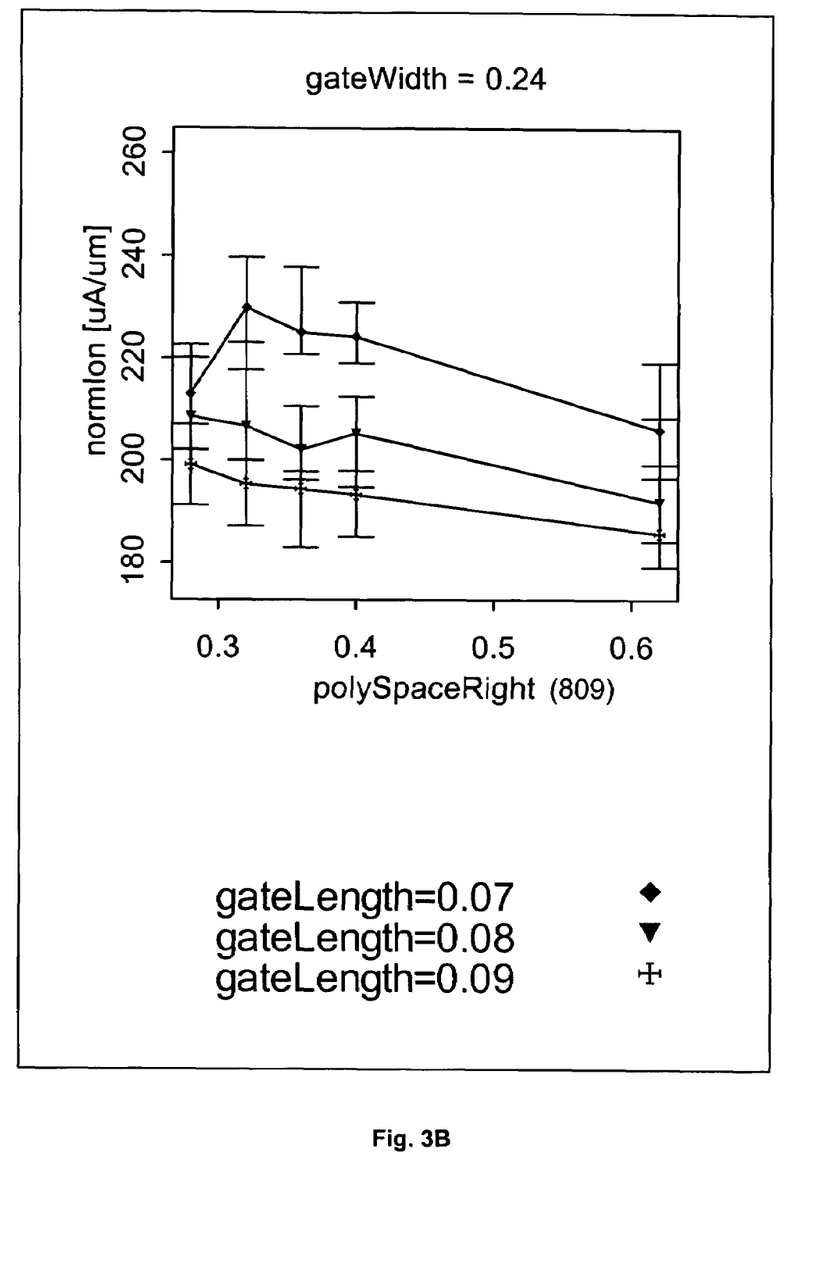
FIG. 3B is an illustration showing an exemplary processing of electrical measurement data associated with the p-channel version of the test structure TRPITCH test structure of FIG. 3A, in accordance with one embodiment of the present invention.

FIG. 3B is an illustration showing an exemplary processing of electrical measurement data associated with the p-channel version of the test structure TRPITCH 800 test structure of FIG. 3A, in accordance with one embodiment of the present invention. FIG. 3B shows plots of the normalized current in saturation (Ion) as a function of the poly-to-poly space 809 for different gate lengths 806. By way of example, it can be observed that Ion current decreases by roughly 10% when there is a large space between the poly lines 808 due to increased polysilicon pitch. The processing of the measured electrical performance data for the TRPITCH 800 test structure indicates that the polysilicon pitch values strongly impact the device performance.

Figure 4B:
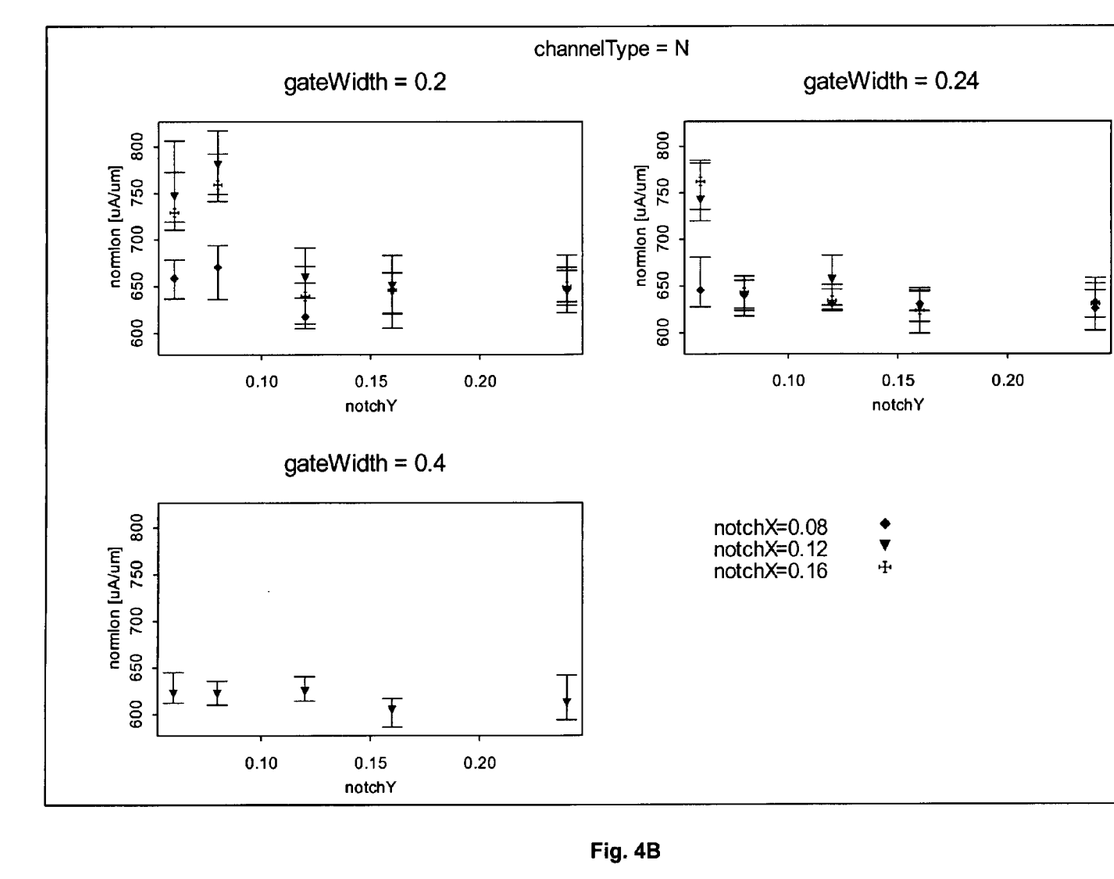
FIG. 4B is an illustration showing an exemplary processing of electrical measurement data associated with the n-channel version of the TRTNOTCH test structure of FIG. 4A, in accordance with one embodiment of the present invention.

FIG. 4B is an illustration showing an exemplary processing of electrical measurement data associated with the n-channel version of the TRTNOTCH 300 test structure of FIG. 4A, in accordance with one embodiment of the present invention. FIG. 4B shows plots of the normalized current in saturation (Ion) as a function of the active region to T-shaped endcap distance 308 for the various investigated T-shaped endcap horizontal extension distances 310 and gate widths 302. By way of example, based on the plots of FIG. 4B it can be seen that the saturation current increases by about 20% when a small distance exists between the active area and the T-shaped endcap when the distance 310 is greater than about 0.08 micron. It can be further observed that the effect on saturation current is greater for smaller gate widths. Thus, processing of the measured electrical performance data for the TRTNOTCH 300 test structure indicates that the dimensions of the T-shaped endcap and its proximity to the active area can have a strong impact on transistor performance.

Figure 5B:
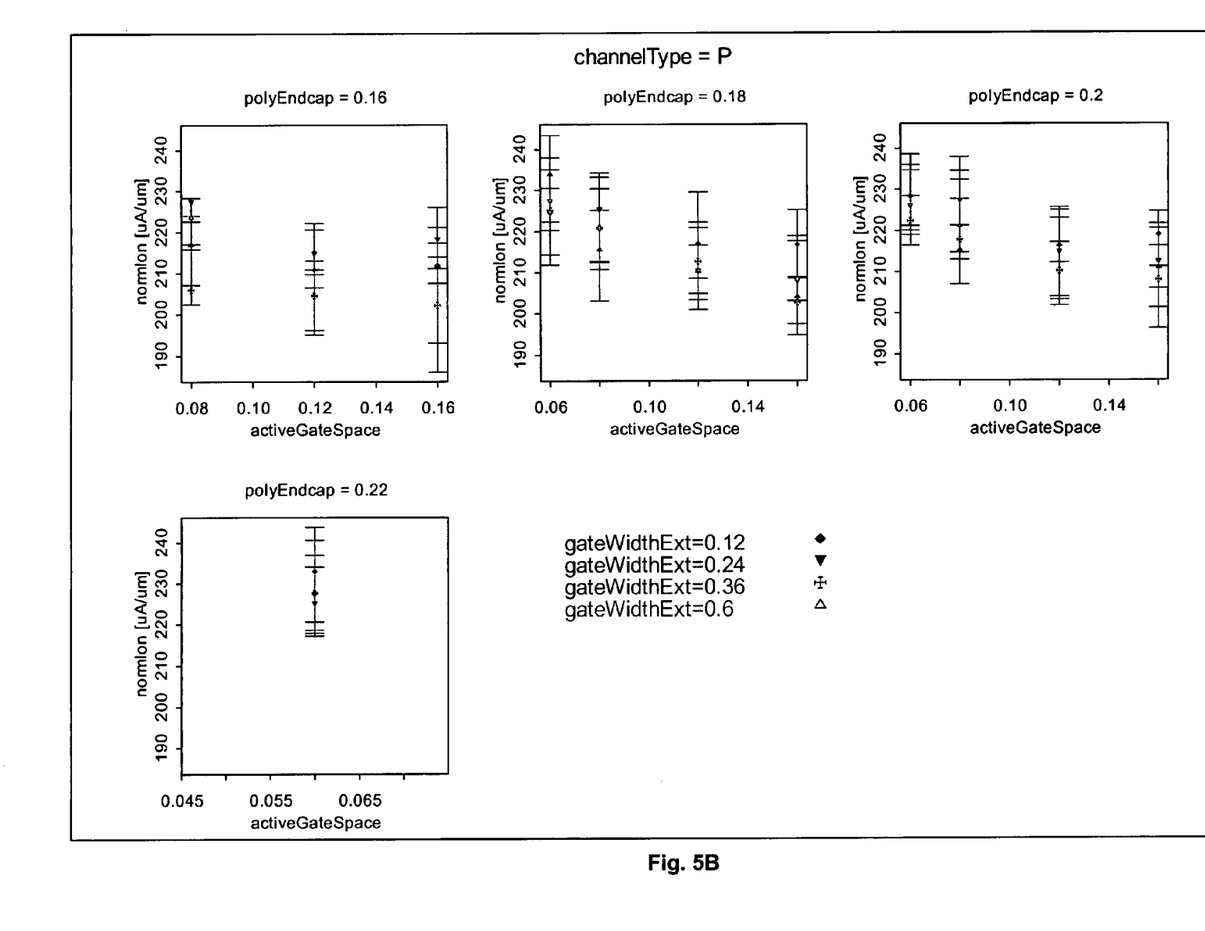
FIG. 5B is an illustration showing an exemplary processing of electrical measurement data associated with the p-channel version of the TRUNOTCH test structure of FIG. 5A, in accordance with one embodiment of the present invention.

FIG. 5B is an illustration showing an exemplary processing of electrical measurement data associated with the p-channel version of the TRUNOTCH 400 test structure of FIG. 5A, in accordance with one embodiment of the present invention. FIG. 5B shows plots of the normalized current in saturation (Ion) as a function of the active-to-gate separation distance 412 for the various investigated active region extension widths 406 and endcap widths 410. By way of example, based on the plots of FIG. 5B it can be seen that saturation current varies significantly with respect to the active-to-gate separation distance 412 in the U-shaped notch region 402, thus inferring that flaring causes sensitivity in saturation current with respect to active area-to-gate spacing in the U-shaped notch region 402.

Figure 6B:
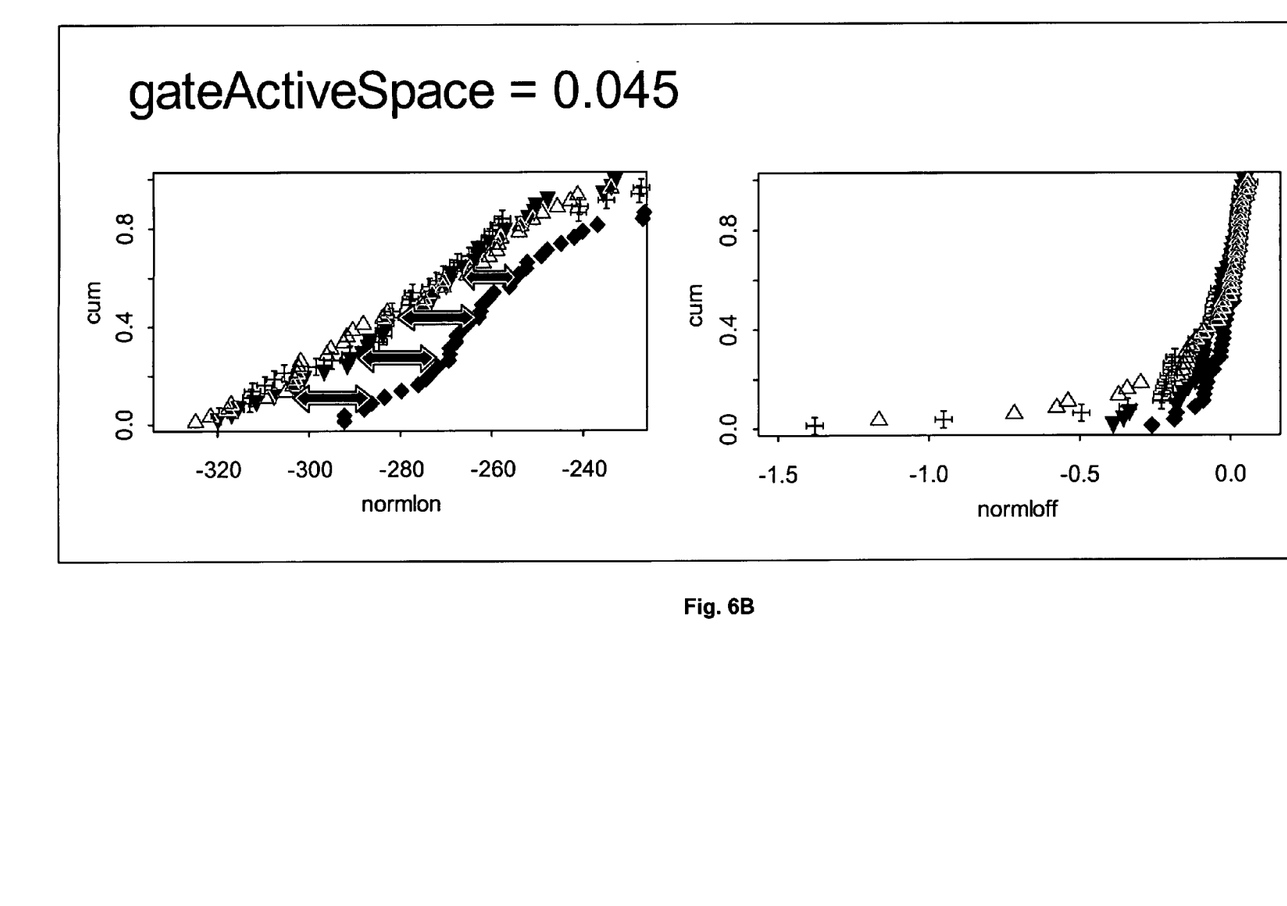
FIG. 6B is an illustration showing an exemplary processing of electrical measurement data associated with the p-channel version of the TRJOINED test structure of FIG. 6A, in accordance with one embodiment of the present invention.

FIG. 6B is an illustration showing an exemplary processing of electrical measurement data associated with the p-channel version of the TRJOINED 600 test structure of FIG. 6A, in accordance with one embodiment of the present invention. FIG. 6B shows cumulative probability plots of the normalized current in saturation (Ion) and sub-threshold current (Ioff) as a function of diffusion active extension 601A for a minimal gate-to-active space 607. By way of example, based on the current plots of FIG. 6B it can be seen that saturation current increases significantly for large active extension 601A values with respect to the reference configuration with zero active extension. Also, it can be observed that layout configurations with large active extension 601A show a tail in the Ioff distribution, with Ioff increasing up to 20 times for some cells, thus inferring that active flaring effects captured by these test structures may impact the performance of product layouts with similar layout configurations.

With reference back to FIG. 1, following operation 111, the method continues with an operation 113 for making design/process changes based on the device performance and manufacturability assessment of operation 111 to layout configurations of semiconductor devices represented by the layout attributes of the test structures. For example, during the early stages of technology development, i.e., prior to finalizing the process integration scheme, the method of FIG. 1 can be applied to redefine, optimize, etc. nominal layout configurations, design rules, and fabrication process conditions (e.g., change focus parameters, exposure parameters, etch parameters, etc.). For instance, the method may suggest the restriction of gate polysilicon pitches based on the impact of device performance variations.

During the product design phase, the method of FIG. 1 can be applied to verify resolution enhancement technique (RET) and optical proximity correction (OPC) effectiveness, revise the RET and OPC schemes, and in parallel with the RET and OPC work optimize the layout of hotspots that are likely to induce electrical performance degradation within the product. It should be kept in mind that in this embodiment the RET and OPC work and hotspot optimization is based on the actual measured electrical performance of the test structures. More specifically, the test structure electrical performance data is analyzed to identify layout configurations where performance is degraded to problematic levels (e.g., parametric failures).

At this point, it is assumed that improvement in printability of the identified layout configurations through RET and OPC optimization based on the printability simulation will provide a corresponding improvement in electrical performance. A further printability simulation may be performed on the test structures corresponding to the identified layout configurations after applying RET and OPC changes to quantify contributions of printability to semiconductor device performance variability.

The printability simulation, having been calibrated based on electrical performance data of the test structures, is used to evaluate the RET and OPC adjustment effects on the hot spots. Furthermore, in addition to or in lieu of RET and OPC optimization, other design and/or fabrication process adjustments can be investigated for the purpose of improving the printability of the identified layout configurations in the interest of improving electrical performance. The decision to use RET and OPC optimization, design adjustment, fabrication process adjustment, or a combination thereof, can be based on the frequency of occurrence of the identified layout configuration in the design and the impact on device performance. After the process integration is finalized, the method of FIG. 1 can be applied to improve process control to minimize device performance variability, adjust process parameters to reduce test structure layout sensitivity, e.g., implement use of split lots or process splits, improve technology entitlement through device optimization, and perform variability decomposition, e.g., lot-to-lot, wafer-to-wafer, die-to-die, within-die, etc.

With the above embodiments in mind, it should be understood that the present invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network of coupled computer systems so that the computer readable code is stored and executed in a distributed fashion.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of reducing layout printability effects on semiconductor device performance, comprising:
   performing a printability simulation on a mask layout over a range of lithography process conditions;
   identifying a layout configuration in the mask layout that is operable to induce functional or parametric failure in a semiconductor device;
   obtaining a test structure that is representative of the identified layout configuration, wherein a design of experiment is associated with the test structure, the design of experiment is defined to investigate effects of variations of one or more layout attributes in the test structure;
   fabricating multiple instances of the test structure on a wafer according to the design of experiment;
   measuring one or more electrical performance characteristics of the fabricated test structures; and based on the measured electrical performance characteristics, determining one or more layout attributes of the test structure that are operable to cause functional or parametric failure.

2. A method as recited in claim 1, further comprising:
changing a layout configuration of a semiconductor device based on the one or more layout attributes of the test structure operable to cause functional or parametric failure.

3. A method as recited in claim 2, wherein changing the layout configuration of the semiconductor device' includes performing Resolution Enhancement Techniques (RET) or Optical Proximity Corrections (OPC).

4. A method as recited in claim 2, wherein changing the layout configuration of the semiconductor device includes altering design parameters of the layout configuration.

5. A method as recited in claim 2, wherein changing the layout configuration of the semiconductor device includes altering fabrication parameters for fabricating the semiconductor device.

6. A method as recited in claim 1, wherein determining the one or more layout attributes of the test structure that are operable to cause functional or parametric failure includes quantifying an impact on semiconductor device performance due to variation of the one or more layout attributes according to the design of experiment associated with the test structure.

7. A method as recited in claim 1, wherein determining the one or more layout attributes of the test structure that are operable to cause functional or parametric failure includes performing a further printability simulation on test structure layouts to quantify contributions of printability to semiconductor device performance.

8. A method as recited in claim 1, wherein determining the one or more layout attributes of the test structure that are operable to cause functional or parametric failure includes performing fabrication process splits to determine an impact of the one or more layout attributes on semiconductor device performance.

9. A method as recited in claim 8, wherein the fabrication process splits include varying focus parameters, exposure parameters, etch parameters, or a combination thereof for fabricating the test structures.

10. A method for reducing semiconductor device performance variability and yield loss, comprising:
performing a printability simulation on a semiconductor device mask layout to identify a critical layout configuration;
developing a test structure to emulate the identified critical layout configuration;
fabricating a test wafer to include multiple instances of the test structure, wherein each instance of the test structure represents a variation in one or more layout attributes of the test structure;
measuring one or more electrical performance characteristics of each test structure instance fabricated on the test wafer;
processing the measured electrical performance characteristics to determine one or more layout attributes of the test structure that are operable to cause functional or parametric failure; and
based on the determined layout attributes of the test structure that are operable to cause functional or parametric failure, identifying a design change, a process change, or a combination thereof to reduce functional or parametric failure of the identified critical layout configuration in the semiconductor device.

11. A method as recited in claim 10, wherein the printability simulation includes decomposing a fabrication process impact on a mask layout feature into a sum of independent contributions.

12. A method as recited in claim 11, wherein the independent contributions include defocus and exposure dependencies, critical dimension (CD) effects on dense and isolated lines, resist effects, etch effects, mask error and misalignment effects, or a combination thereof.

13. A method as recited in claim 10, wherein the critical layout configuration represents a local region of a mask layout having one or more feature geometries that are susceptible to printability deficiency causing adverse electrical performance.

14. A method as recited in claim 10, wherein the test structure is defined as an active device to emulate the geometric layout and electrical performance of an active device associated with the critical layout configuration.

15. A method for defining a semiconductor device design and fabrication process window with respect to electrical performance, comprising:
obtaining a test structure from a library of test structures defined to emulate critical layout configurations known to be sensitive to printability effects prevalent in semiconductor device mask layouts;
fabricating a test wafer to include multiple instances of the test structure, wherein each instance of the test structure represents a variation in one or more attributes of the test structure;
measuring electrical performance characteristics of each test structure instance fabricated on the test wafer; and
processing the measured electrical performance characteristics to identify unacceptable electrical performance of the test structure as a function of variation in the test structure attributes.

16. A method as recited in claim 15, further comprising:
developing the library of critical layout configuration data by performing a printability simulation on a mask layout over a range of lithography process conditions.

17. A method as recited in claim 15, wherein the critical layout configuration represents a local region of a mask layout having feature geometries that are susceptible to fabrication and lithographic problems.

18. A method as recited in claim 15, wherein the test structure is defined as an active device to emulate the geometric layout and electrical performance of an active device associated with a critical layout configuration.

19. A method as recited in claim 15, further comprising:
fabricating multiple test wafers according to split lots, wherein a wafer associated with each split lot is subjected to a variation in one or more fabrication processes.

20. A method as recited in claim 19, wherein the variation in one or more fabrication processes includes varying focus parameters, exposure parameters, etch parameters, or a combination thereof.

* * * * *